United States Patent [19]

Sato et al.

[11] Patent Number: 4,564,754

[45] Date of Patent: Jan. 14, 1986

[54] METHOD AND APPARATUS FOR OPTICALLY MEASURING A CURRENT

[75] Inventors: Tadashi Sato, Mito; Genji Takahashi, Hitachi; Yoshiaki Inui, Ibaraki, all of Japan

[73] Assignee: Hitachi, Ltd., Tokyo, Japan

[21] Appl. No.: 472,834

[22] Filed: Mar. 7, 1983

[30] Foreign Application Priority Data

Mar. 8, 1982 [JP] Japan ................... 57-35226
Jun. 28, 1982 [JP] Japan ................. 57-110019
Aug. 23, 1982 [JP] Japan ................. 57-144724

[51] Int. Cl.$^4$ .......................... G02F 1/01; H01J 40/14
[52] U.S. Cl. ..................... 250/225; 324/244; 324/96; 350/375; 356/72
[58] Field of Search ............... 250/225, 227; 324/96, 324/244; 356/72; 350/374, 375, 376

[56] References Cited

U.S. PATENT DOCUMENTS

| | | | |
|---|---|---|---|
| 3,605,013 | 9/1971 | Yoshikawa | 324/96 |
| 3,675,125 | 7/1972 | Jaecklin | 250/225 |
| 3,708,747 | 1/1973 | Lesueur | 324/96 |
| 3,743,929 | 7/1973 | Lesueur | 324/96 |
| 3,746,983 | 7/1973 | Renz | 324/96 |
| 3,753,101 | 8/1973 | Aumont | 324/96 |
| 3,778,619 | 12/1973 | Carnel | 250/225 |
| 3,810,013 | 5/1984 | Müller | 324/96 |
| 4,253,061 | 2/1981 | Ono | 324/96 |
| 4,370,612 | 1/1983 | Puech et al. | 324/96 |
| 4,442,350 | 4/1984 | Rashleigh | 350/375 |

FOREIGN PATENT DOCUMENTS 515065  9/1976  U.S.S.R. ................... 324/96

OTHER PUBLICATIONS

"Optical Voltage and Current Measuring System for Electric Power Systems", by M. Kanoi et al., 85 SM 316-5, IEEE/PES 1985 summer meeting in Vancouver, B.C., Canada.

Primary Examiner—John K. Corbin
Assistant Examiner—R. Eyssallenne
Attorney, Agent, or Firm—Antonelli, Terry & Wands

[57] ABSTRACT

A current is measured by making use of a rotation of polarization plane in a magnetic field, that is, a Faraday effect. A conductor under measurement is transversely inserted into a center opening of a Faraday effect glass which has at least two total reflection areas on a periphery thereof so that a light directed into the Faraday effect glass is circulated around the conductor and emitted externally. The light emitted from the Faraday effect glass is split into at least two light beams, which are converted to electric signals by photoelectric elements, and A.C. components contained in the electric signals are extracted and compared. The electric signals are corrected based on the comparison result.

The present measuring apparatus and method attain high precision current measurement in a stable manner over an extended period.

16 Claims, 20 Drawing Figures

METHOD AND APPARATUS FOR OPTICALLY MEASURING A CURRENT

The present invention relates to method and apparatus for optically measuring a current, and more particularly to an optical current measuring apparatus suitable to measure a current flowing in a high voltage conductor.

A winding type current transformer has been used in current measurement for the measurement or protection of a commercial power system. The prior art winding type current transformer, however, has problems in insulation and structure when a transmitted voltage is very high such as 500 kV–700 kV, and the apparatus becomes large in size and expensive.

Recently, a current measuring method based on a principle different from that of the prior art apparatus has been put into practice. In one approach, a current measuring method which uses an optical current measuring apparatus or a so-called optical current transformer which utilizes a physical phenomenon called a Faraday effect, that is, a rotation of a polarization plane in a magnetic field has been proposed.

In principle, when a polarized light passes through a glass which exhibits the Faraday effect such as lead glass (hereinafter referred to as a Faraday effect glass) disposed in a magnetic field created by a current, a polarization plane is rotated by an angle $\theta = V \cdot H \cdot L$ (where V is a Verdet's constant, H is a magnetic field strength in a direction of light propagation and L is a length of the glass in the direction of the light propagation). This rotation is detected by a known method to measure the magnetic field strength H to measure a current flowing in the vicinity of the glass. (See U.S. Pat. Nos. 3,708,747; 3,743,929 and 3,753,101.)

However, when a current is to be measured in a conventional current measuring site where a plurality of conductors are arranged in the vicinity of the Faraday effect glass by the optical current transformer manufactured in accordance with such a principle, a distinction between the conductor under measurement and the other conductors is not attained in principle and the magnetic fields created by the conductors other than the conductor under measurement are sensed. As a result, a large error is obtained.

In order to reduce the measurement error, it has been proposed by the Japanese Utility Model Publication No. 44-7589 to arrange polarization members such as the Faraday effect glass in a rectangular pattern around the conductors, arrange reflection mirrors between the polarization members, apply only a linearly polarized light ray extracted from light transmitted through a light conduction rod by a polarizer to the polarization members, apply lights transmitted through the polarization members to an analyzer to detect a Faraday rotation angle and extract a signal light from the light conduction rod. The magnetic fields created by the other conductors are cancelled out by summing the polarization rotation angles of the plurality of polarization members and only the polarization rotation angle by the magnetic field of the conductor under measurement is added. In this manner, the current of the conductor under measurement is distinguished from the currents of the other conductors. In the above construction, light conduction rods may be arranged in place of the reflecting mirrors, analyzers may be provided in input paths of the light conduction rods and polarizers may be provided in output paths.

However, because of complexity of light paths, the above construction has the following disadvantages. It is difficult to maintain a relative position of the polarization member and the reflecting mirror or the light conduction rod at a high precision. The linearly polarized light is elliptically polarized by a phase change of the light by the reflection in the reflection mirror or the light conduction rod and a detectable polarization rotation angle is significantly reduced making the current detection difficult. Further, in order to distinguish the current of the conductor under measurement from the currents of the other conductors to precisely measure the current, it is necessary that the polarization members have the same sensitivity, but the sensitivities of the polarization members to the magnetic fields substantially differ from each other because the lights transmitted through the reflection mirrors or the light conduction rods are no longer linearly polarized. This makes the high precision measurement of the current of the conductor difficult.

As another approach to measure a large current, the U.S. Pat. No. 3,746,983 proposes to surround a current flowing conductor by a rectangular Faraday effect member having mirror surfaces at four corners and an inner surface having reflecting surfaces on both sides thereof at a portion along a linear side. In the proposed apparatus, a light beam from a light source is polarized by a polarizing filter and applied to one side of the inner surface of the Faraday effect member and reflected thereby at an angle of 45 degrees and reflected by each of the four corners to circulate the member, and emitted outwardly from the other side of the inner surface. The emitted light beam further passes through another Faraday effect member having a coil wound thereon so that a polarization rotation angle can be detected. A current is supplied to the coil from a variable current source so that a magnetic field produced thereby rotates the polarization plane of the light beam passing through another Faraday effect member to return to a polarization plane of an incident light on the rectangular Faraday effect member surrounding the conductor. A current of the coil is metered under this condition to measure the current of the conductor which is proportional to the current of the coil.

However, in the above apparatus, the total reflection of the light beam in the rectangular Faraday effect member surrounding the conductor has a phase difference between a component perpendicular to the reflection plane and a component parallel to the reflection plane. As a result, the linear polarization at the incident point is changed to the elliptic polarization as described above, making the detection of the current of the conductor quite difficult.

A method for measuring a current of a conductor by winding an optical fiber directly on the conductor under measurement instead of using the Faraday effect glass has been proposed. (See U.S. Pat. Nos. 3,605,013 and 3,810,013.) In this method, however, when a linearly polarized light passes through the optical fiber, the polarization angle is readily varied by a mechanical influence such as bend, distortion and vibration of the optical fiber and an elliptic polarization occurs irregularly. As a result, a high precision and highly stable holding mechanism for the optical fiber is required. This is not practical.

As discussed hereinabove, an optical current measuring apparatus having a high precision and high stability has not been attained in the prior art.

It is an object of the present invention to provide an optical current measuring apparatus which attains a light path circulation with a single polarization member and allows precise and stable current measurement.

It is another object of the present invention to provide a magneto-optical current measuring apparatus and a measuring method which allow precise and stable current measurement with a small aging effect.

It is a further object of the present invention to provide an optical current measuring apparatus which enables precise and wide range of current measurement.

In accordance with the present invention, a Faraday effect glass has an opening at a center thereof so that a conductor under measurement passes through the opening to cross perpendicular to the Faraday effect glass, and the Faraday effect glass has at least two total reflection surfaces on a periphery thereof to cause a light to circulate a light path around the conductor under measurement so that the light circulated around the light path is made a polarization rotation by a Faraday effect so as to constitute the optical current measuring apparatus. In order to enhance a sensitivity, the reflected light at a changing point of the light path direction in the Faraday effect glass is totally internally reflected twice in order to prevent the distortion of the linear polarization (i.e. to prevent the linear polarization from converting to the elliptic polarization).

In accordance with another aspect of the present invention, there are provided means for constantly monitoring and detecting a change of a proportional constant caused when the light transmitted through the Faraday effect glass is applied to an analyzer and an optical current output from two lines of light energy emitted from the analyzer is converted to an electric signal, and means for adjusting amplification factors of amplifiers in accordance with the detected change of the proportional constant so that a high precision current measurement is attained stably over an extended period.

In accordance with a further aspect of the present invention, a plurality of Faraday effect glasses of different materials are arranged in parallel and one of the Faraday effect glasses is selected in accordance with a range of measurement to allow a wide range of measurement.

The present invention will be apparent from the following detailed description taken in conjunction with the accompanying drawings, in which.

Figure 1:
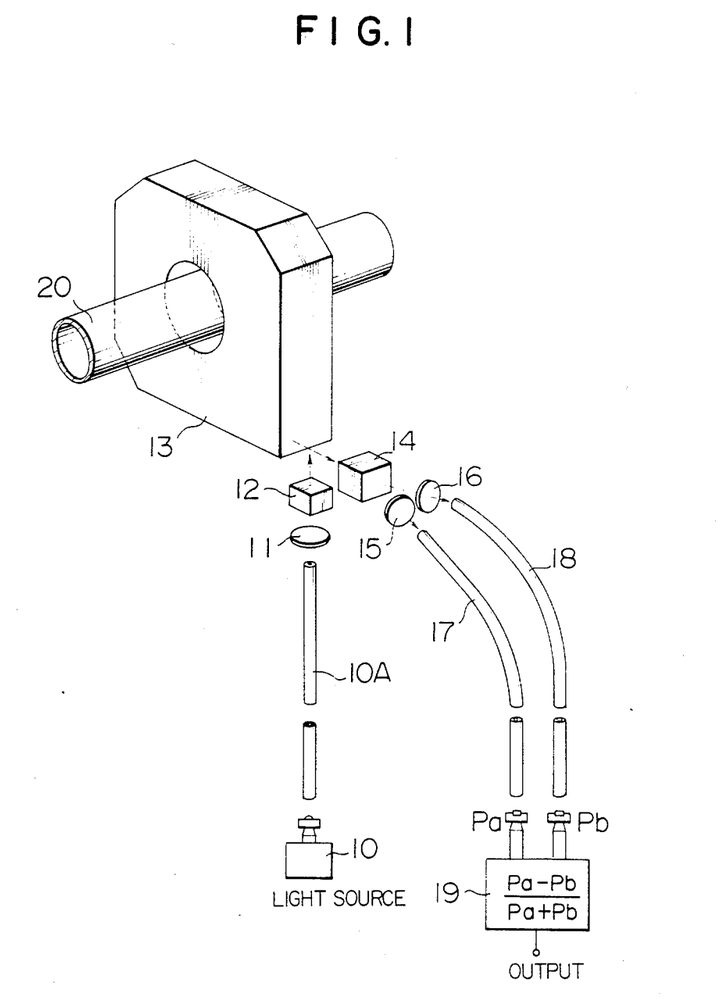
FIG. 1 shows a configuration of an optical current measuring apparatus in accordance with a first embodiment of the present invention.
Figure 2:
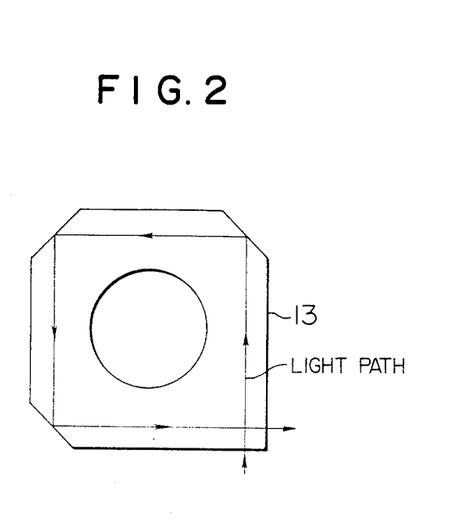
FIG. 2 shows a front view of a Faraday effect glass used in the first embodiment.

A first embodiment of the optical current measuring apparatus of the present invention is shown in FIG. 1. An input light path comprises a light source 10 for emitting light, an optical fiber 10A for transmitting the light from the light source 10, a condenser lens 11 for condensing the light emitted from the optical fiber 10A and preventing scattering of the light and a polarizer 12 made of a high molecule film, a vapor deposition film or a polarizing prism for linearly polarizing the light from the condenser lens 11. The light source 10 may be a light emitting diode, a laser diode or a laser of another type. The output light from the polarizer 12 is directed to a Faraday effect glass 13. FIG. 2 shows a front view of the Faraday effect glass 13. An incident light goes straight along a light path of the Faraday effect glass 13 as shown by a solid line, it is reflected by a first total reflection plane (having an angle of 45 degrees to the incident light), goes straight toward a second total reflection plane, it is reflected by the second total reflection plane and then reflected by a third total reflection plane. The reflected light then goes out of the Faraday effect glass 13 transversely to the incident light. A center area of the Faraday effect glass 13 is cut away to permit the insertion of a conductor 20 thereinto.

The light circulates around the conductor 20 under measurement by the three total reflection planes provided in the Faraday effect glass 13. The linearly polarized light propagates through the Faraday effect glass while it inter-links with the conductor 20 under measurement (primary conductor). A polarization rotation angle θ by the Faraday effect after one circulation around the conductor 20 is given by $$\theta = V \int H dl = VI$$

where V is a Verdet's constant, H is a magnetic field strength around the conductor and I is a current under measurement.

Thus, the polarization rotation is exactly proportional to the current under measurement. Accordingly, the current is measured more precisely than the prior art apparatus.

The light emitted from the Faraday effect glass 13 is sent to an output light path. The output light is received by an analyzer 14 such as a polarization prism which splits the light into two light beams. The two light beams are condensed by condenser lenses 15 and 16. The linearly polarized light condensed by the condenser lens 15 is transmitted to a light detector 19 through an optical fiber 17, and the linearly polarized light condensed by the condenser lens 16 is transmitted to the light detector 19 through an optical fiber 18. The light detector 19 calculates a Faraday rotation angle from $(P_a - P_b)/(P_a + P_b)$ based on the two linearly polarized lights $P_a$ and $P_b$.

A material of the Faraday effect glass may be flint glass such as lead glass or heavy flint glass, fused glass such as crown glass or silica glass, or porcelain glass. The material of the Faraday effect glass should be properly selected because the Verdet's constant and a detectable maximum current differ depending on a wavelength of the light source 10 as shown in Tables 1 and 2.

TABLE 1

| | Wavelength 830 nm (infrared light emitting diode or semiconductor laser) | |
|---|---|---|
| | Verdet's constant (min/A) | Maximum detectable current (kA) |
| Fused silica | −0.006 | −400 |
| Crown glass | −0.012 | −200 |
| Flint glass | −0.03 | −90 |

TABLE 2

| | Wavelength 633 nm (He—Ne laser) | |
|---|---|---|
| | Verdet's constant (min/A) | Maximum detectable current (kA) |
| Fused silica | −0.012 | −230 |
| Crown glass | −0.02 | −120 |
| Flint glass | −0.05 | −50 |

Since the light path is formed by the Faraday effect glass, it is hardly subjected to a surrounding temperature and a mechanical vibration and a variation of the light path can be substantially neglected. As a result, a high precision measurement is stably attained over an extended period.

In the illustrated embodiment, the number of times of the total reflection in the Faraday effect glass is three. Since the present invention can be realized by circulating the light path around the conductor, a Faraday effect glass having a shape as shown in FIG. 3 may be used to reduce the number of times of reflection.

Figure 3:
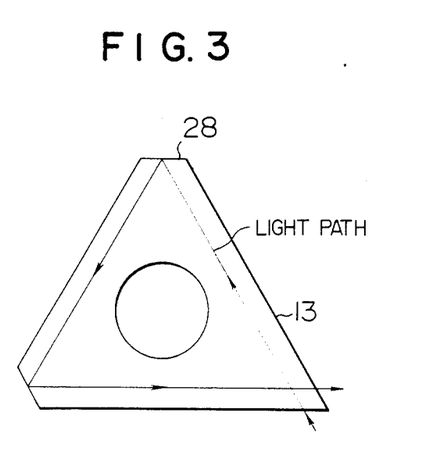
FIG. 3 shows a front view of another Faraday effect glass used in the first embodiment.

The total reflection planes in the Faraday effect glasses shown in FIGS. 2 and 3 may be formed by optically polishing or plating silver or aluminum.

The Faraday effect glasses shown in FIGS. 2 and 3 are simple in structure and easy to manufacture but the total internal reflection occurs only once for each deflection of the light path. As a result, the linearly polarized light is readily changed to the elliptically polarized light for each total internal reflection and hence the Faraday rotation angle may be reduced and the sensitivity may be lowered. An embodiment which resolves the above problem is described below.

Figure 4:
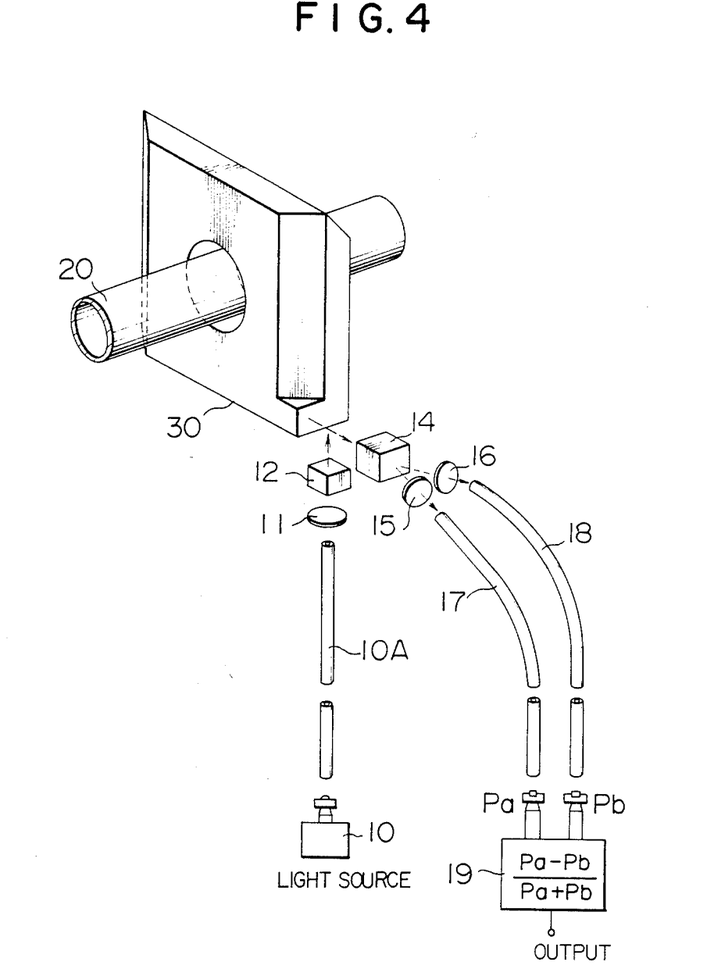
FIG. 4 shows a configuration of an optical current measuring apparatus in accordance with a second embodiment of the present invention.
Figure 5:
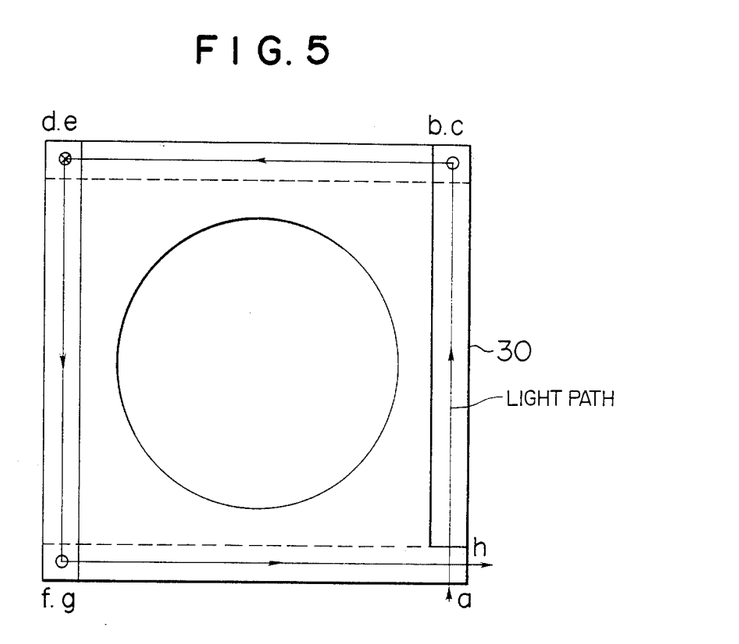
FIGS. 5, 6, 7, 8 and 9 show a front view, a plan view, a left side view, a right side view and a bottom view, respectively, of a Faraday effect glass used in the second embodiment.
Figure 6:
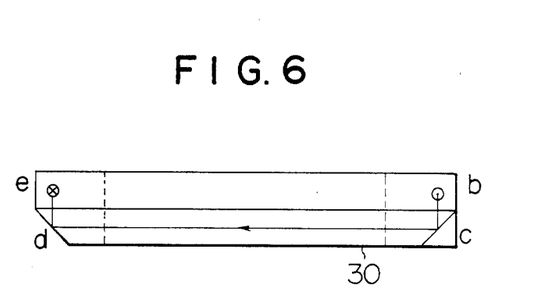
Figure 7:
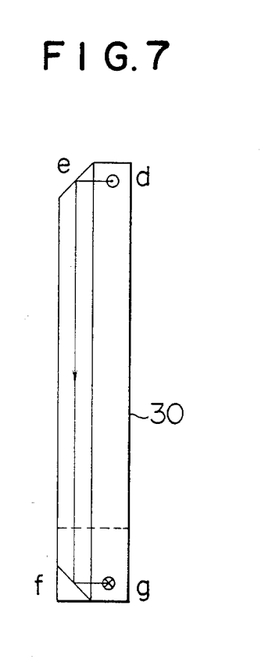
Figure 8:
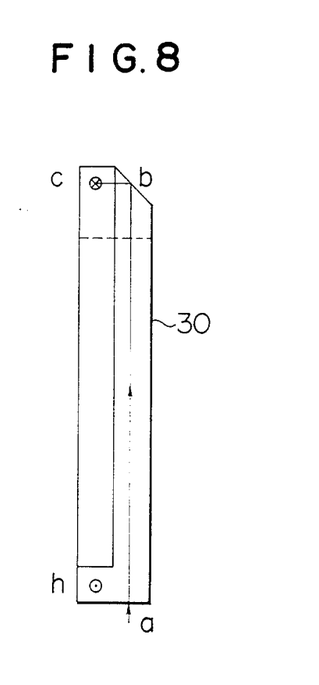
Figure 9:
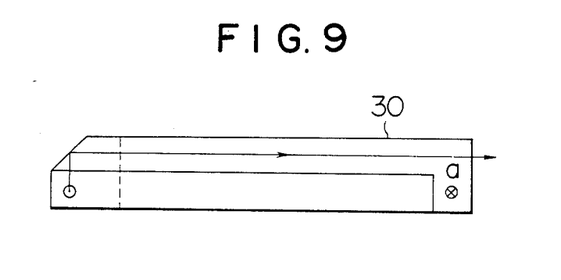

A configuration of a second embodiment of the optical current measuring apparatus of the present invention is shown in FIG. 4, in which the like elements to those shown in FIG. 1 are designated by the like numerals. In the present embodiment, the total internal reflection planes of the Faraday effect glass are improved such that the total internal reflection occurs twice at each light path in the Faraday effect glass to prevent the reduction of the sensitivity.

An example of a shape of the Faraday effect glass used in the present embodiment is shown in FIGS. 5 to 9. The total internal reflection occurs six times, that is, at points b, c, d, e, f and g. It is desirable that axial distances between the points b and c, d and e and f and g are as small as possible in order to prevent the affect by the magnetic fields created by other conductors. The light from the polarizer 12 is applied to the point a, goes straight as shown by a solid line, totally reflected at the point b and deflected by 90 degrees, totally reflected at the point c and goes leftward perpendicular to the incident light. The light is totally reflected at the point d and axially deflected (and goes straight in the opposite direction to the light going to the point c), and it is totally reflected at the point e downward in the opposite direction to the incident light. The linearly polarized light is reflected at the point f frontward and then reflected rightward so that the light is emitted from the point h with an angle of 90 degrees to the incident light. The light circulates around the conductor 20 under measurement six times by total internal reflection. By total internal reflecting the light twice at a short interval at each light path deflection point, an ideal Faraday rotation can be attained.

The rotation of the linearly polarized plane by the Faraday effect is proportional to a magnetic field strength parallel to the light path and a light path length. Since the currents flowing in the other conductors than the conductor 20 which are in the vicinity of the conductor 20 are nulled by the integration along the light path in the Faraday effect glass 30, an effect thereby can be neglected. Accordingly, the Faraday rotation angle $\theta$ by the linearly polarized light circulated around the conductor 20 is essentially proportional to the current flowing in the conductor 20. Since the total internal reflection planes of the Faraday effect glass 30 can be readily prepared even on a peripheral area by optically polishing, they can be formed without bonding.

The present embodiment has an improved sensitivity over the embodiment of FIG. 1.

The Faraday effect glass 30 shown in FIGS. 5 to 9 may be further improved to facilitate the manufacture. Examples thereof are shown in FIGS. 10 to 13 and FIGS. 14 to 16.

Figure 10:
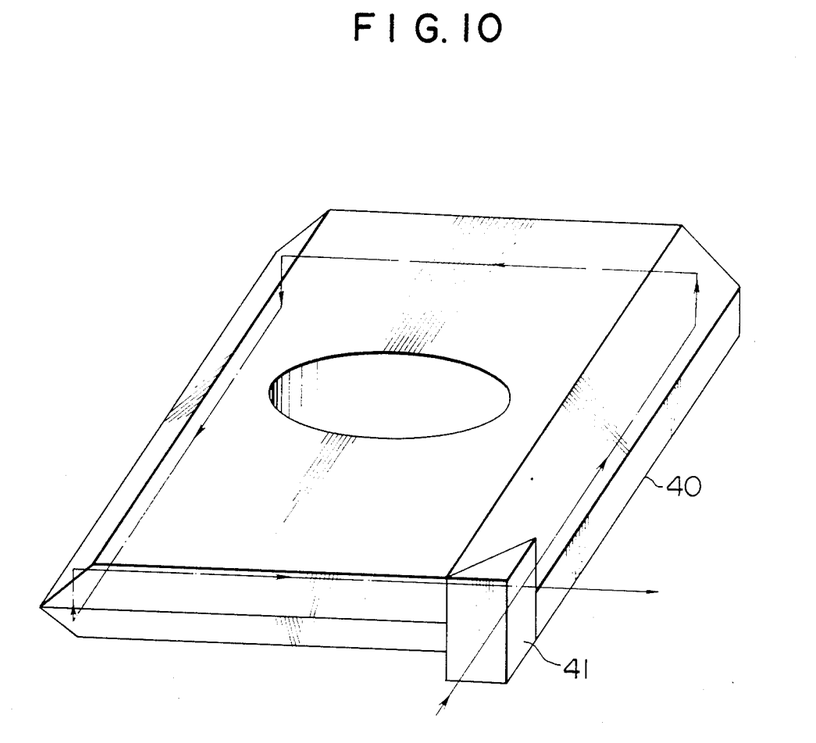
FIGS. 10, 11, 12 and 13 show a perspective view, a front view, a right side view and a bottom view, respectively, of another Faraday effect glass used in the second embodiment.
Figure 11:
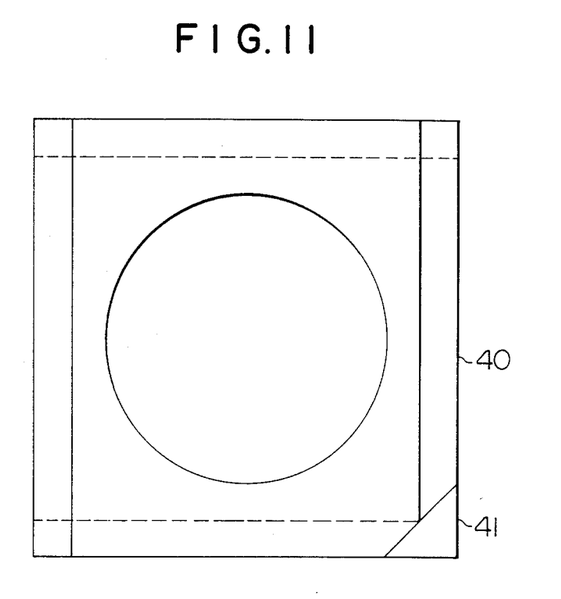
Figure 12:
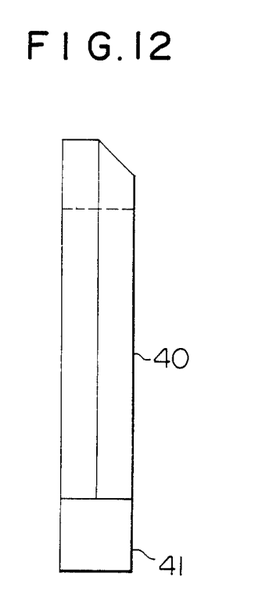
Figure 13:
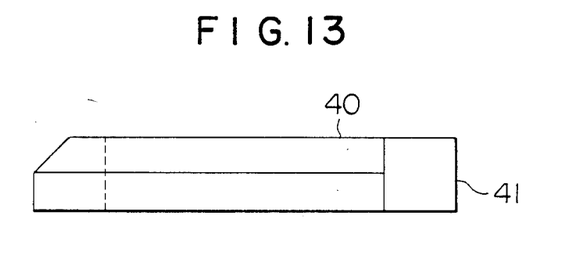

In a first modification shown in FIGS. 10 to 13, a corner of a Faraday effect glass 40 which forms a light input section and a light output section is cut away and a rectangular prism 41 is bonded to that area. As a result, the polishing of the right side is facilitated (because each of the optically polished surfaces is planar and no stepping is required) and the manufacture is facilitated. In the present modification, the light transmitted through the polarizer goes into the Faraday effect glass 40 from one side of the rectangular prism 41 as shown in FIG. 10 and is totally internally reflected six times, that is, twice at each of three corners at a short interval as shown by a chain line, and goes out of the other side of the rectangular prism 41.

Figure 14:
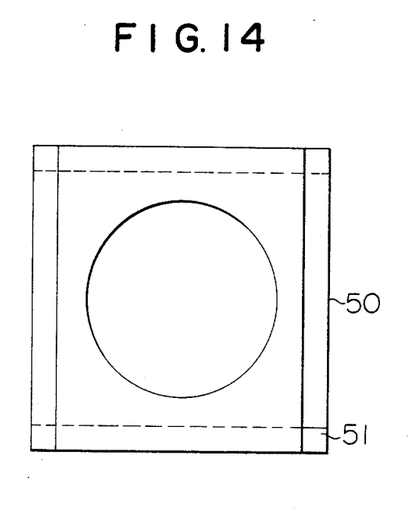
FIGS. 14, 15 and 16 show a front view, a right side view and a bottom view, respectively, of a further Faraday effect glass used in the second embodiment.
Figure 15:
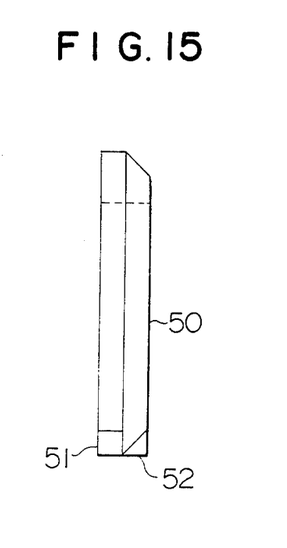
Figure 16:
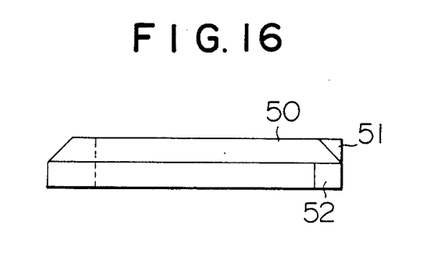

In a second modification shown in FIGS. 14 to 16, rectangular prisms 51 and 52 are bonded to a corner of a Faraday effect glass 50 which functions as a light input section a and a light output section b. With this structure, all of the optically polished surfaces are planar and the cutting of the corner is not necessary. Therefore, the manufacture is further facilitated.

As described above, according to the optical current measuring apparatus of the present invention, the Faraday effect glass inter-links (traverses) the conductor under measurement and the portions which cause the Faraday rotation are in union and not affected by the currents flowing in the other conductors. Accordingly, a high precision current measurement is stably attained over an extended period.

In the optical current transformer of the optical current measuring apparatus described above, when a directly polarized light passes through the Faraday effect glass, the polarization plane is rotated by an angle proportional to a product of a length of the glass and a magnetic field component along the direction of the light propagation. In order to detect the rotation angle of the polarization plane, a polarization prism such as a Wollaston prism or a polarization beam splitter is used as an analyzer. By properly selecting an angle relative to the polarizer which linearly polarizes the light, the two light beams emitted from the analyzer are split as lights of energies $k(1+\sin2\theta)$ and $k(1-\sin2\theta)$ where $\theta$ is the Faraday rotation angle and k is a constant representing a light transmission efficiency.

In a normal condition, $2\theta << 1$ and the above values are approximated by $k(1+2\theta)$ and $k(1-2\theta)$, respectively. Light energies $P_1$ and $P_2$ which are proportional to those light energies are represented by $P_1 = a_1 k(1+2\theta)$ and $P_2 = a_2 k(1-2\theta)$, where $a_1$ and $a_2$ are proportional constants. By transmitting the light energies $P_1$ and $P_2$ through optical fibers and converting them to electric signals by photo-diodes, photo-current outputs represented by $I_1 = a_1 b_1 k(1+2\theta)$ and $I_2 = a_2 b_2 k(1-2\theta)$ where $b_1$ and $b_2$ are light constants, are obtained.

Theoretically, if the characteristics of the optical fibers and the photo-diodes are identical,
$a_1 = a_2$ and $b_1 = b_2$ and the Faraday rotation angle is proportional to $(I_1 - I_2)/(I_1 + I_2)$, but normally $a_1 \neq a_2$ and $b_1 \neq b_2$ and hence they must be compensated. Output voltages $V_1$ and $V_2$ of the amplifiers are given by $V_1 = a_1 b_1 C_1 k(1+2\theta)$ and $V_2 = a_2 b_2 C_2 k(1-2\theta)$ Thus, by adjusting the amplification factors $C_1$ and $C_2$ of the amplifiers, $a_1 b_1 C_1$ is made to be equal to $a_2 b_2 C_2$ so that the Faraday rotation angle is proportional to $(V_1 - V_2)/(V_1 + V_2)$. Since this method uses a ratio of the outputs of the two light beams, it is not affected by a variation of the transmitted light.

However, if $a_1 b_1$ and $a_2 b_2$ deviate from the values adjusted to meet the relation of $a_1 b_1 C_1 = a_2 b_2 C_2$ by a temperature characteristic of the optical parts such as the optical fibers or the condenser lens or the aging effect, $a_1 b_1 C_1$ is not equal to $a_2 b_2 C_2$ and a detection error for the Faraday rotation angle increases.

In the optical current measuring apparatus of the present invention, an A.C. (Alternating Current) component of the current is utilized to constantly monitor and detected the variations of $a_1 b_1$ and $a_2 b_2$. When the current under measurement is $I_{DC} + I_{AC}$, the Faraday rotation angle $\theta$ is represented by $Ve(I_{DC} + I_{AC})$ and hence $V_1 = a_1 b_1 C_1 k(1 + 2VeI_{DC} + 2VeI_{AC})$ $V_2 = a_2 b_2 C_2 k(1 - 2VeI_{DC} - 2VeI_{AC})$ where Ve is a Verdet's constant. The above equations can be rewritten as $V_1 = a_1 b_1 C_1 k(1 + 2VeI_{DC}) + a_1 b_1 C_1 k 2VeI_{AC}$ $V_2 = a_2 b_2 C_2 k(1 - 2VeI_{DC}) - a_2 b_2 C_2 k 2VeI_{AC}$ Noting the second terms of the right sides of the equations for $V_1$ and $V_2$, the A.C. component of $V_1$ is equal to the A.C. component of $V_2$ after the adjustment has been made to meet the relation of $a_1 b_1 C_1 = a_2 b_2 C_2$. Thus, if $a_1 b_1$ or $a_2 b_2$ changes by the deterioration of the optical fibers or the deterioration of the photo-diodes, the A.C. component of the electric signal $V_1$ and the A.C. component of the electric signal $V_2$ are detected and $C_1$ and $C_2$ are adjusted such that the A.C. component of $V_1$ is equal to the A.C. component of $V_2$. In this manner, the error due to the deterioration of the optical fibers and the photo-diodes, the temperature characteristic and the aging effect can be corrected. Since a D.C. (Direct Current) current used in a commercial power system necessarily includes a ripple current component $I_{AC}$, the present invention can be applied to such a system.

A further embodiment of the optical current measuring apparatus and method of the present invention is explained with reference to FIG. 17. The conductor 20 through which the current under measurement flows extends through a Faraday effect glass 13 like in the previous embodiments. The light from the light source 10 is transmitted through the optical fiber 10A, condensed by the condenser lens 11 and the condensed light is directed into the Faraday effect glass 30 through the polarizer 12. The light emitted from the Faraday effect glass 30 goes into the analyzer 14 where it is split into two light beams which are directed to the condenser lenses 15 and 16, respectively. The lights condensed by the condenser lenses 15 and 16 pass through the optical fibers 17 and 18, respectively and are directed to photo-diodes 60 and 61, respectively, which function as light detectors. The outputs of the photo-diodes 60 and 61 are supplied to current-to-voltage conversion amplifiers 62 and 63, respectively. An output of the first current-to-voltage conversion amplifier 63 is supplied to a band-pass filter 64, a subtractor 65 and an adder 66, and an output of the second current-to-voltage conversion amplifier 62 is supplied to a band-pass filter 67 and a multiplier 68. An output of the band-pass filter 64 is supplied to a divider 71 through a detector 69 and an integrator 70, and an output of the band-pass filter 67 is supplied to the other terminal of the divider 71 through a detector 72 and an integrator 73. An output of the divider 71 is supplied to the other terminal of the multiplier 68 and an output of the multiplier 68 is supplied to the subtractor 65 and the adder 66, and an output of the adder 66 is supplied to a divider 74. An output of the subtractor 65 is also applied to the divider 74.

The operation of the present embodiment is now described. In order to detect the Faraday rotation angle $\theta$ when the light from the light source 10 goes into the Faraday effect glass 30 through the optical fiber 10A, the condenser lens 11 and the polarizer 12 and goes out after one circulation, the emitted light is split into the two light beams by the analyzer 14 and these two light beams are condensed by the condenser lenses 15 and 16 and efficiently directed into the optical fibers 17 and 18, and the lights transmitted therethrough are converted to the photocurrent by the photo-diodes 60 and 61 to produce the electric signals. The current outputs from the photo-diodes 62 and 63 are converted to the voltage signals by the current-to-voltage conversion amplifiers 62 and 63. By adjusting the amplification factors $C_1$ and $C_2$ of the current-to-voltage conversion amplifiers 62 and 63, the condition of $a_1 b_1 C_1 = a_2 b_2 C_2$ described above can be met. The A.C. components of the output voltage signals $V_1$ and $V_2$ of the current-to-voltage amplifiers 62 and 63 are extracted by the band-pass filters 64 and 67, and they are converted to D.C. signals by the detectors 69 and 72 and the D.C. signals are integrated by the gated integrators 70 and 73. Through the integration, the affect by the noises included in the D.C. signal can be reduced.

If the output of the integrator 70 becomes lower than the output of the integrator 73 by the temperature characteristics or the aging effects of the optical fibers 17 and 18 and the photo-diodes 60 and 61, a ratio of those outputs is calculated by the divider 68 and it is multiplied to the output signals of the current-to-voltage amplifiers 62 and 63 by the multiplier 68 to correct the error. The adder 66, the subtractor 65 and the divider 74 are well-known arithmetic circuits to detect the Faraday rotation angle based on the fact that the Faraday rotation angle $\theta$ is proportional to $(V_1 - V_2)/(V_1 + V_2)$. The ratio of the outputs of the integrator 70 and the integrator 73 which is initially set to approximately unity may exceed unity due to dew condensation on one of the optical fibers or breakage of one of the optical fibers. This abnormal condition can also be monitored by the illustrated circuit to diagnose the failure when the operation condition deviates from a normal range.

In accordance with the present embodiment, the light emitted from the Faraday effect glass is photo-electrically converted by the photo-diodes 60 and 61 and the photo-currents are supplied to the arithmetic circuit through the current-to-voltage conversion amplifiers 62 and 63 having the amplification factors $C_1$ and $C_2$, respectively, and the arithmetic circuit extracts the A.C. components of the outputs and corrects the measurement error due to environment condition variation such as the temperature characteristics and the aging effects of the components by the divider 71 and the multiplier 68 based on the change of the ratio of the A.C. components so that a high precision current measurement is stably attained over an extended period. By monitoring the ratio of the A.C. components for the two light paths, the failure in which the operation condition deviates from the normal range can be diagnosed. Further, since the present embodiment uses the analog arithmetic circuit, the calibration speed for the error is fast.

Figure 17:
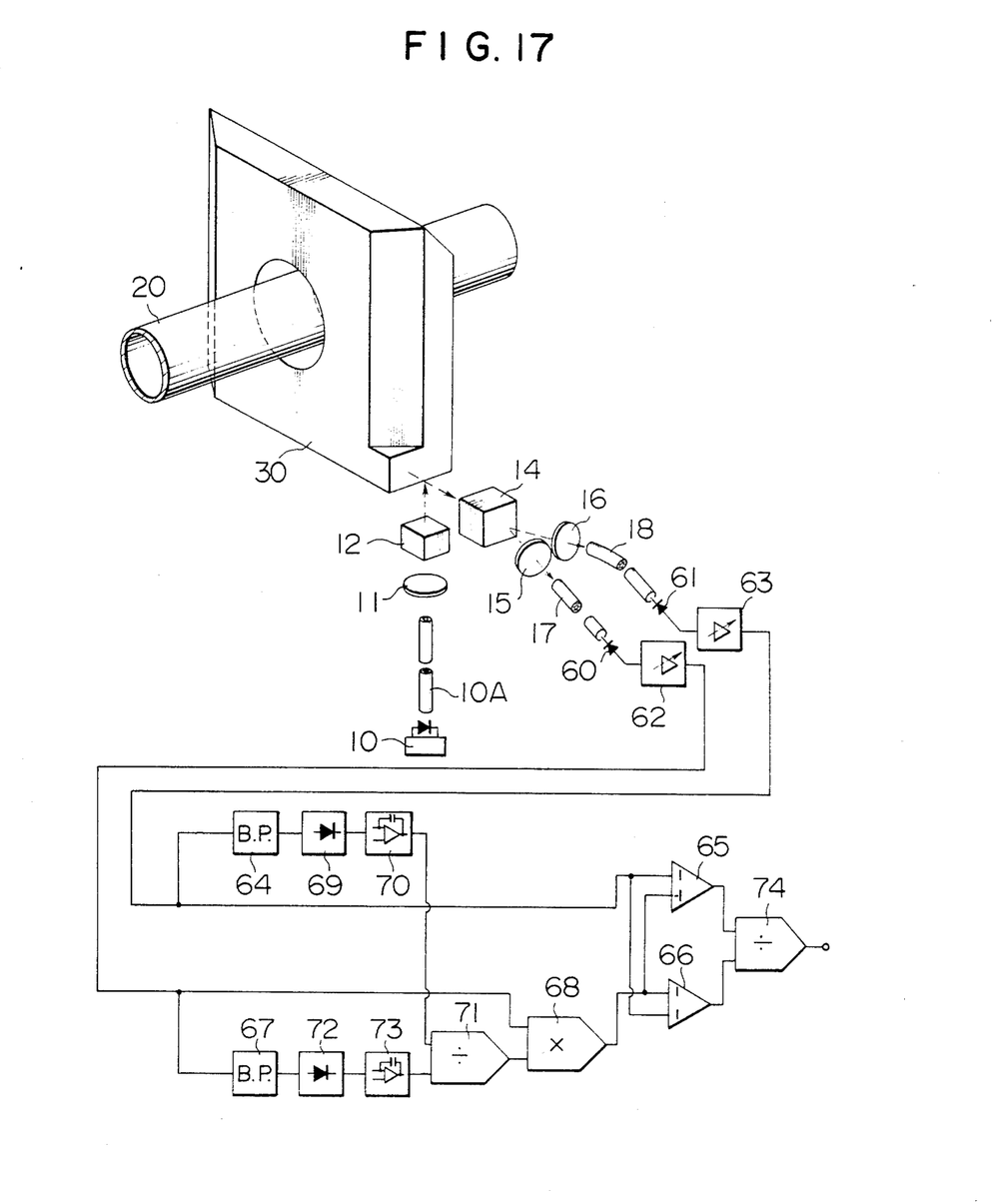
FIG. 17 shows a configuration of other embodiment of the optical current measuring apparatus and method of the present invention.
Figure 18:
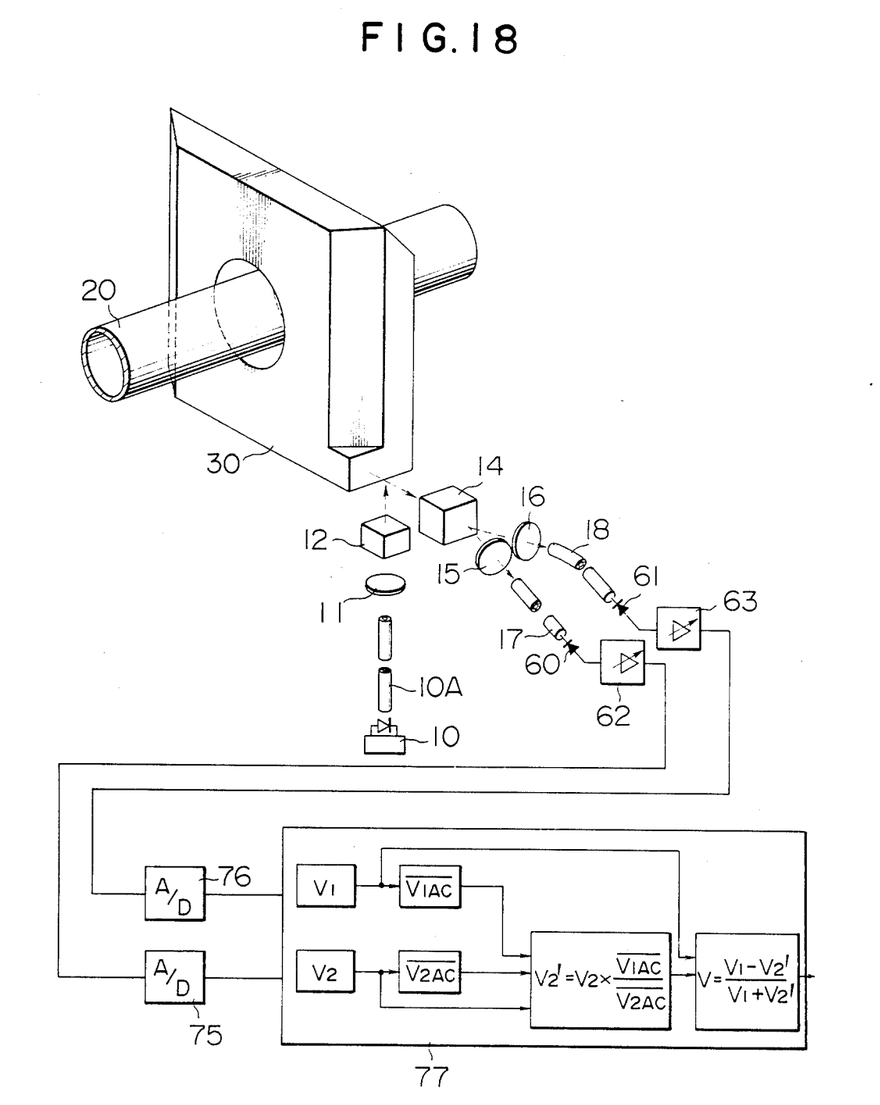
FIG. 18 shows a configuration of a further embodiment of the present invention.

Referring to FIG. 18, another embodiment of the optical current measuring apparatus of the present invention is explained. The light emitted from the light source 10 goes into the Faraday effect glass 30 through the same path as that of FIG. 17, and the light emitted therefrom goes into the photo-diodes 60 and 61 through the same path. The output current signals from the photo-diodes 60 and 61 are supplied to the current-to-voltage conversion amplifiers 62 and 63, and the outputs therefrom are supplied to analog-to-digital (A/D) converters 75 and 76, and the outputs thereof are supplied to a digital signal processor 77 such as a microprocessor.

The analog voltage signals from the current-to-voltage conversion amplifiers 62 and 63 are converted to digital signals $V_1$ and $V_2$ by the A/D converters 75 and 76, and A.C. components $V_{1AC}$ and $V_{2AC}$ in the digital signals $V_1$ and $V_2$ are extracted by the digital signal processor 77, which carries out the following arithmetic operations:

$$V_2' = V_2 \times \frac{V_{1AC}}{V_{2AC}}$$

-continued
$$V = \frac{V_1 - V_2'}{V_1 + V_2'}$$

The signal V is used as a digital output of the optical current measuring apparatus.

In accordance with the present embodiment, since the microprocessor is used as the digital signal processor 77 the construction of the arithmetic unit is simpler than that of FIG. 17 and an error in the arithmetic operation is small because of the digital processing. Accordingly, the measuring apparatus of higher precision can be provided.

It should be understood that the present invention, like the embodiment of FIG. 17, can measure the current stably over an extended period without increase of precision error due to the temperature characteristics and the aging effects of the components.

As discussed hereinabove, the optical current measuring apparatus which uses the Faraday effect glass has an advantage that it allows the measurement of the current flowing through a particular conductor without being affected by the currents flowing in the other conductors. However, there are many kinds of material to be used, and when a different material is used, the Faraday rotation angle differs. On the other hand, if a Faraday effect glass of a single kind of material is used in the optical current measuring apparatus or the optical current transformer, a range of measurement is limited. For example, the Faraday rotation angle of a lead glass is 0.12 min./AT for wavelength of 633 nm, and the Faraday rotation angle of a silica glass of the same shape and same dimension is 0.012 min./AT, which is one tenth (1/10) of that of the lead glass. Thus, the lead glass having a larger rotation angle is suitable for the measurement under a low magnetic field but the rotation angle saturates in a high magnetic field and correct measurement is not attained. On the other hand, the silica glass having a smaller rotation angle is suitable for the measurement under a high magnetic field but a sensitivity under a low magnetic field is too low to assure precise measurement.

Figure 19:
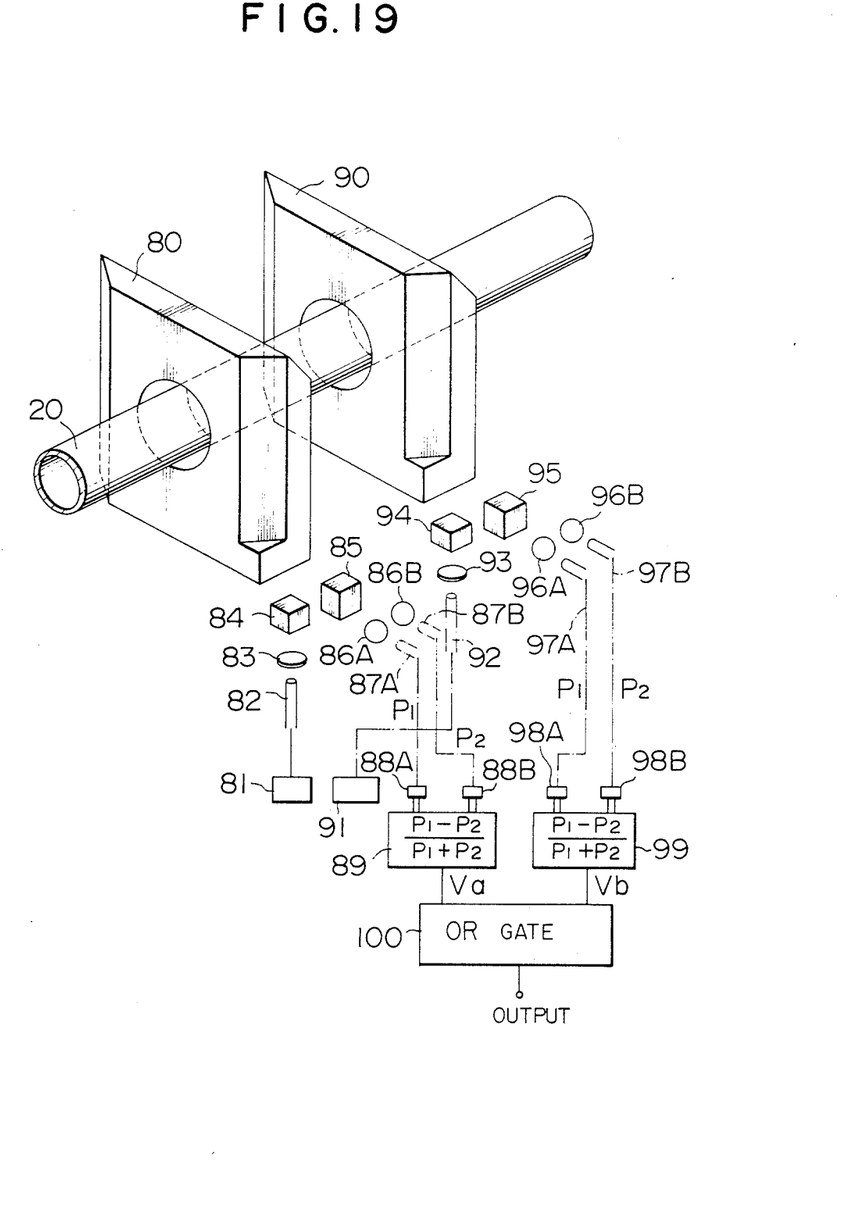
FIG. 19 shows a schematic diagram of a further embodiment of the optical current measuring appparatus of the present invention.

In order to utilize the different characteristics of different materials of the Faraday effect glass, an embodiment of the optical current measuring apparatus of the present invention shown in FIG. 19 uses parallelly arranged first Faraday effect glass 80 made of lead glass having an internal light path which links to a conductor 20 and second Faraday effect glass 90 made of silica glass having an internal light path which links to the conductor 20.

A linearly polarized light is applied to the first Faraday effect glass 80 from a light source 81 through an optical fiber 82, a condenser lens 83 and a polarizer 84. The incident linearly polarized light is totally internally reflected twice at each corner of the first planar Faraday effect glass 80, circulates around the conductor 20, is emitted from a light output plane, is split by an analyzer 85 such as a Rochon prism, a Wollaston prism or a polarization beam splitter, and the split light beams are directed to light detectors 88A and 88B such as photodiodes through condenser lenses 86A and 86B and optical fibers 87A and 87B and they are converted to electric signals. The electric signals are then converted to a rotation angle signal Va by an arithmetic circuit 89, an output of which is supplied to an OR gate 100.

Similarly, a linearly polarized light is applied to the second Faraday effect glass 90 from a light source 91 through an optical fiber 92, a condenser lens 93 and an analyzer 94. The incident linearly polarized light is totally internally reflected twice at each corner of the second Faraday effect glass 90, circulates around the conductor 20, is emitted from a light output plane and is split by an analyzer 95, and the split light beams are directed to light detectors 98A and 98B through condenser lenses 96A and 96B and optical fibers 97A and 97B and they are converted to electric signals. The electric signals are similarly converted to a rotation angle signal $V_b$ by an arithmetic circuit 99, an output of which is supplied to the OR gate 100.

Figure 20:
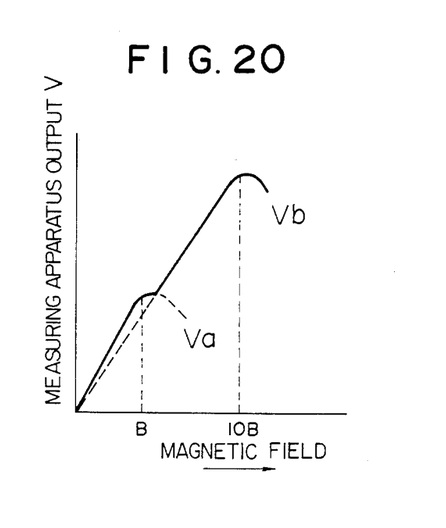
FIG. 20 shows a characteristic chart of an output of the optical current measuring apparatus.

A maximum value V of the rotation angle signals $V_a$ and $V_b$ is produced by the OR gate 100. The maximum value signal V from the OR gate 100 or the measuring apparatus changes as shown by a solid line curve in FIG. 20. When the first Faraday effect glass 80 of the lead glass having a larger Faraday rotation angle per ampere-turn and a higher sensitivity is used, a characteristic curve $V_a$ of FIG. 20 which shows a maximum output when a magnetic field created by the current in the conductor 20 is B is obtained. On the other hand, when the second Faraday effect glass 90 of the silica glass having a smaller Faraday rotation angle per ampere-turn and a low sensitivity is used, a characteristic curve $V_b$ of FIG. 20 which shows a maximum output when a magnetic field is 10B. Thus, the output V of the measuring apparatus derived from the OR gate 100 shows a characteristic as shown by the solid line, which allows the current measurement in a range from a low magnetic field to a high magnetic field.

As described hereinabove, the optical current measuring apparatus of the present invention has an advantage that the current can be measured at a high precision over an expanded current range without being affected by the currents in the other conductors.

In order to enhance the detection sensitivity of the measuring apparatus, it is necessary to properly select a material of the glass used. Alternatively, a shorter wavelength light may be used to attain the same effect. However, when the shorter wavelength light is used, the light source is expensive and the transmission loss in the optical fiber increases. Accordingly, those approaches may be used in appropriate combination.

What is claimed is:

1. An optical current measuring apparatus comprising:
    a conductor for conducting a current under measurement;
    a Faraday effect glass disposed to link perpendicularly to said conductor and having at least two total reflection areas at corners thereof;
    a light source for directing a light to a light input section of said Faraday effect glass;
    a polarizer for linearly polarizing the light from said light source and directing the linearly polarized light to said Faraday effect glass;
    said linearly polarized light being reflected at said total reflection areas of said Faraday effect glass such that said linearly polarized light circulates around said conductor as linearly polarized light and emits from a light output section of said Faraday glass as linearly polarized light, whereby said current is measured based on a Faraday rotation angle of the light by a magnetic field created by said current flowing in said conductor;
    said total reflection areas of said Faraday effect glass being configured for enabling said linearly polarized light reflected thereat to circulate and be emitted from said Faraday effect glass as linearly polarized light;
    said Faraday effect glass being planar and having an opening through which said conductor extends;
    an analyzer disposed to face said light output section of said Faraday effect glass for splitting the light from said light output section into two light beams;
    a pair of condenser lenses disposed to condense said two light beams from said analyzer;
    a pair of optical fibers disposed to face said condenser lenses;
    a pair of light detectors arranged to receive lights transmitted through said optical fibers; and
    an arithmetic unit for calculating said Faraday rotation angle based on outputs from said light detectors.

2. An optical current measuring apparatus according to claim 1 wherein each of said total reflection areas includes two closely arranged reflection planes.

3. An optical current measuring apparatus according to claim 1 wherein said total reflection areas of said Faraday effect glass extend over an entire periphery of the planar glass, and a single prism is disposed to interrupt both said light input section and said light output section.

4. An optical current measuring apparatus according to claim 1 wherein said total reflection areas of said Faraday effect glass extend over an entire periphery of the planar glass, and separate prisms are disposed at said light input section and said light output section, respectively.

5. An optical current measuring apparatus comprising:
    a conductor for conducting a current under measurement;
    a Faraday effect glass disposed to link perpendicularly to said conductor and having at least two total reflection areas at corners thereof;
    a light source for directing a light to a light input section of said Faraday effect glass;
    a polarizer for linearly polarizing the light from said light source and directing the linearly polarized light to said Faraday effect glass;
    said linearly polarized light being reflected at said total reflection areas of said Faraday effect glass such that said linearly polarized light circulates around said conductor and emits from a light output section of said Faraday effect glass, whereby said current is measured based on a Faraday rotation angle of the light by a magnetic field created by said current flowing in said conductor;
    said Faraday effect glass being planar and having an opening through which said conductor extends;
    each of said total reflection areas at the corners of said Faraday effect glass having two closely arranged reflection planes;
    an analyzer disposed to face said light output section of said Faraday effect glass for splitting the light from said light output section into two light beams;
    a pair of condenser lenses disposed to condense said two light beams from said analyzer;
    a pair of optical fibers disposed to face said condenser lenses;
    a pair of light detectors arranged to receive lights transmitted through said optical fibers; and an arithmetic unit for calculating said Faraday rotation angle based on outputs from said light detectors.

6. A optical current measuring apparatus according to claim 5 wherein said total reflection areas of said Faraday effect glass extend over an entire periphery of the planar glass, and a single prism is disposed to interrupt both said light incident section and said light output section.

7. An optical current measuring apparatus for measuring a current flowing through a conductor by detecting a Faraday rotation angle, said apparatus comprising:
 a Faraday effect glass having an opening through which said conductor is passed thereby to interlink said Faraday effect glass with a current flow in said conductor, said Faraday effect glass having three total internal reflection portions disposed in a light path, said light path looping around a periphery of said conductor;
 a light source emitting said light into said light path in said Faraday effect glass;
 a polarizer disposed between said light source and said Faraday effect glass for linearly polarizing the light from said light source, said linearly polarized light being passed through said light path for reflection at said total internal reflection portions of said Faraday effect glass and then for exciting from said Faraday effect glass;
 an analyzer for splitting said polarized light excited from said Faraday effect glass into two light beams;
 a pair of optical fibers in which said two light beams converged by said condenser lenses are guided therealong;
 a pair of light detectors for detecting said two light beams guided by said optical fibers; and
 means for calculating said Faraday rotation angle on the basis of the detected two light beams so that said current flowing through said conductor is determined according to said Faraday rotation angle,
 wherein each of said total internal reflection portions is formed by adjoining two total internal reflection planes, incident planes of the light at each of said total internal reflection planes being perpendicular to each other and said light being total internally reflected at each of said total internal reflection planes so that said light reflected by said total internal reflection portions is maintained as linearly polarized light.

8. An optical current measuring apparatus according to claim 7, wherein said Faraday effect glass has a prism disposed in said light path so that the light emitted from said light source enters into said Faraday effect glass via said prism and the total internally reflected light exits through said prism.

9. An optical current measuring apparatus according to claim 7, wherein said light detectors are photo-electric devices transforming the light guided by said optical fibers into electric signals, and said calculating means includes a pair of amplifiers for amplifying said electric signals, a pair of signal extraction means for extracting A.C. components from said amplified electric signals, comparator means for comparing said A.C. components from said signal extraction means, and signal correction means for correcting said amplified electric signals in accordance with an output of said comparator means so that an error in the Faraday rotation angle due to environmental condition variation in said light path is compensated.

10. An optical current measuring apparatus according to claim 9, wherein said Faraday effect glass has a prism disposed in said light path so that the light emitted from said light source enters into said Faraday effect glass via said prism and the total internally reflected light exits through said prism.

11. An optical current measuring apparatus according to claim 9, wherein each of said signal extraction means is a band-pass filter.

12. An optical current measuring apparatus according to claim 7, wherein said light detectors are photoelectric devices transforming the light guided by said optical fibers into electric signals, and said calculating means includes a pair of amplifiers for amplifying said electric signals, a pair of A/D converters for analog to digital converting said amplified electric signals, and a digital signal processing unit for extracting A.C. components from said converted amplified electric signals and for calculating said current on the basis of said converted amplified electric signals in digital form and said A.C. components in digital form thereby to output said calculated current in digital form.

13. An optical current measuring apparatus according to claim 12, wherein said Faraday effect glass has a prism disposed in said light path so that the light emitted from said light source enters into said Faraday effect glass via said prism and the total internally reflected light exits through said prism.

14. An optical current measuring apparatus according to claim 7, wherein said apparatus includes further combination of said Faraday effect glass, said light source, said polarizer, said analyzer said pair of condenser lenses, said pair of optical fibers, said pair of light detectors, and said calculating means, said Faraday effect glasses in the respective combinations having different characteristics of magnetic field versus Faraday rotation angle so that said Faraday effect glasses share measuring ranges of the current, and said apparatus further includes signal selection means for selecting a higher one of the Faraday rotation angles calculated in said calculating means of the respective combinations.

15. An optical current measuring apparatus according to claim 14, wherein one of said Faraday effect glasses of the respective combinations is made of a lead glass and another of said Faraday effect glasses is made of a silica glass.

16. An optical current measuring apparatus according to claim 14, wherein each Faraday effect glass has a prism disposed in said light path so that the light emitted from said light source enters into said Faraday effect glass via said prism and the total internally reflected light exits through said prism.

* * * * *